US012690423B2

(12) United States Patent　　(10) Patent No.:　　US 12,690,423 B2
Reitinger　　(45) Date of Patent:　　Jul. 21, 2026

(54) SHIELDING DEVICE FOR A CHUCK, CORRESPONDING CHUCK, AND CORRESPONDING WAFER PROBER ASSEMBLY

(71) Applicant: ERS ELECTRONIC GMBH, Germering (DE)

(72) Inventor: Klemens Reitinger, Germering (DE)

(73) Assignee: ERS ELECTRONIC GMBH, Germering (DE)

( * ) Notice: Subject to any disclaimer, the term of this patent is extended or adjusted under 35 U.S.C. 154(b) by 269 days.

(21) Appl. No.: 18/698,868

(22) PCT Filed: Sep. 5, 2022

(86) PCT No.: PCT/EP2022/074556
§ 371 (c)(1),
(2) Date: Apr. 5, 2024

(87) PCT Pub. No.: WO2023/057143
PCT Pub. Date: Apr. 13, 2023

(65) Prior Publication Data
US 2025/0006545 A1　　Jan. 2, 2025

(30) Foreign Application Priority Data

Oct. 6, 2021　(DE) ..................... 10 2021 211 263.3

(51) Int. Cl.
*H10P 72/00*　　(2026.01)
*H10P 72/76*　　(2026.01)
(52) U.S. Cl.
CPC ...... *H10P 72/7611* (2026.01); *H10P 72/0616* (2026.01)
(58) Field of Classification Search
CPC ......................... H10P 72/7611; H10P 72/0616
(Continued)

(56) References Cited

U.S. PATENT DOCUMENTS 5,018,278 A　　5/1991　Aehnelt et al.
5,835,997 A　*　11/1998　Yassine .............. G01R 31/2851
324/754.03
(Continued)

FOREIGN PATENT DOCUMENTS

DE　　4109908 A1　　10/1992
DE　　69322206 T2　　4/1999
(Continued)

OTHER PUBLICATIONS

International Search Report for PCT/EP2022/074556 dated Dec. 15, 2022.

*Primary Examiner* — Richard Isla
*Assistant Examiner* — Trung Q Nguyen
(74) *Attorney, Agent, or Firm* — NORTON ROSE FULBRIGHT US LLP

(57) ABSTRACT

A shielding device for a chuck of a wafer prober includes a ring mechanism having (I) a first ring that is attachable to an outer periphery of the chuck and (II) a second ring (i) mounted on the first ring so as to be displaceable along a vertical axis of the chuck relative to the first ring, (ii) having a cavity that (a) communicates with bores of the second ring and (b) has a connection for a gas supply device for production of an air bearing via the bores opposite a plate-shaped counter bearing above the second ring, and (iii) elastically pretensioned vertically, by a pretensioning device that can be compressed by the air bearing such that there is no contact between the second ring and the plate-shaped counter bearing, so that the second ring projects beyond an upper side of the chuck.

16 Claims, 7 Drawing Sheets

(58) Field of Classification Search
USPC .......................... 324/500, 600, 76.11, 754.03
See application file for complete search history.

(56) References Cited

U.S. PATENT DOCUMENTS

| | | | |
|---|---|---|---|
| 7,607,647 B2 * | 10/2009 | Zhao ..................... | B25B 11/005 |
| | | | 269/21 |
| 9,291,664 B2 | 3/2016 | Gaggl | |
| 2008/0145190 A1 | 6/2008 | Yassour et al. | |
| 2008/0229811 A1 | 9/2008 | Zhao et al. | |
| 2015/0054535 A1 | 2/2015 | Yoshioka | |
| 2023/0014966 A1 * | 1/2023 | Snow ................. | G01R 31/2877 |

FOREIGN PATENT DOCUMENTS

| | | | |
|---|---|---|---|
| DE | 102013215781 A1 | 2/2015 | |
| EP | 2659279 B1 | 12/2018 | |
| JP | 2000-183120 A | 6/2000 | |
| JP | 2011-091262 A | 5/2011 | |
| JP | 2011210956 A | 10/2011 | |
| WO | 2012122578 A1 | 9/2012 | |
| WO | 2017188343 A1 | 11/2017 | |
| WO | 2020148226 A | 7/2020 | |

* cited by examiner

SHIELDING DEVICE FOR A CHUCK, CORRESPONDING CHUCK, AND CORRESPONDING WAFER PROBER ASSEMBLY

CROSS-REFERENCE TO RELATED APPLICATIONS

The present application is the national stage of International Pat. App. No. PCT/EP2022/074556 filed Sep. 5, 2022, and claims priority under 35 U.S.C. § 119 to DE 10 2021 211 263.3, filed in the Federal Republic of Germany on Oct. 6, 2021, the content of each of which are incorporated herein by reference in their entireties.

FIELD OF THE INVENTION

The present invention relates to a shielding device for a chuck, a corresponding chuck and a corresponding wafer prober setup.

BACKGROUND

In the manufacturing process involved in the production of integrated circuits, function tests (wafer tests) are carried out on wafers which have not yet been diced, so that defective integrated circuits can be identified and singled out in good time. For this purpose, a wafer which is to be tested is inserted in a wafer prober and is brought to a desired test temperature by means of a temperature-controllable chuck located therein. When the wafer is at the desired test temperature, an electrical connection is made with the contact surfaces of the integrated circuit to be tested by means of a contact needle arrangement which is located on a needle head. The needle head with the contact needles is attached onto a probe card which creates an interface between a test system and the wafer by means of the contact needles of the needle head. The wafer prober probe card is usually mechanically anchored in a wafer prober and connected to a test unit by a cable harness. The wafer prober probe card is usually made up of a printed circuit board (PCB) to which the needle head with the contact needles is attached in a projecting manner.

For testing, the chuck with the wafer located thereupon can be moved in the wafer prober laterally and in a vertical direction beneath the needle head, so that all integrated circuits located on the wafer which are to be tested can be reached.

Wafer tests of this kind are typically carried out in the temperature range between −60° C. and +300° C., in exceptional cases even at still more extreme temperatures above or below the zero point.

The subject matter of shielding the wafer to be tested, whether against external environmental influences (electrical interference, light, moisture, etc.), or for the deliberate conditioning of the wafer environment (moisture, temperature, etc.), is known in principle.

DE 10 2013 215 781 A1 discloses a thermal shielding device for a wafer prober having a first and second heat-conductive plate, a structured heat-insulating intermediate layer provided between the first and second heat-conductive plate, which intermediate layer forms a duct system for a temperature-controlling fluid which is delimited on a first side by the first plate and on a second side by the second plate, a first inlet for the temperature-controlling fluid into the duct system and a first outlet for the temperature-controlling fluid out of the duct system, and a feedthrough opening for feeding through a needle head attached onto the wafer prober probe card.

DE 41 09 908 A1 discloses a setup for testing semiconductor wafers using a prober table for receiving the semiconductor wafer to be tested, having a mount for receiving probe holders, where the prober table is arranged within a container which is designed to be open upwardly, where the upwardly open container is covered by a plate which contains an opening for feeding through probes and where flow-out elements are provided within the container which are connected to a source for air, gas or the like by means of a connection.

DE 69 322 206 T2 discloses a wafer test station with integrated facilities for earthing, Kelvin connection and shielding, comprising a clamping device for holding a test device, a holder for an electrical sensor for making contact with the test device, and a positioning mechanism for the selective movement of at least one clamping device and one holder to, or away from, the other, along a leading axis.

The clamping device has at least separate first, second and third electrically conductive clamping device elements which are insulated in respect of one another and are positioned at progressively greater distances from the holder along the leading axis, where the clamping device has, in addition, at least one detachable, an electrical connector device for the detachable receiving of a cable from a test unit, where the connector mechanism has at least two conductive connector elements which are electrically insulated in respect of one another, where each of the connector elements is electrically connected to another of the first and second clamping device elements in each case in an interlocking manner and is not electrically connected to the third clamping device element, and where each of the clamping device elements also has at least one surface which is oriented to a surface of another of the clamping device elements.

The clamping device also has dielectric spacers arranged between respective surfaces of the respective clamping device elements, where the spacers only extend over small portions of the surface and thereby leave air gaps between the opposite faces over relatively large portions of their respective surfaces.

EP 2 659 279 B1 discloses a device for the electrical high-voltage testing of a semiconductor wafer comprising a pressure chamber, the inside of that can be overpressured via a compressed gas line, where the pressure chamber is arranged on a needle card with test needles, where the pressure chamber has at least one part which is movable relative to the needle card and where a gap, in which an air bearing is formed, is provided between the front end of the movable part of the pressure chamber facing the semiconductor wafer and the semiconductor wafer.

Wafer probing can be divided into two categories, namely what is referred to as analytical wafer probing and what is referred to as production, or fully automatic, wafer probing. In the case of analytical wafer probing, more manual and semiautomatic machines are used, as this is more about acquiring information than the rate of production; fully automatic wafer probing focuses on pass/fail decisions, rate of production and automation. Estimates are based on there currently being approx. 20% analytical and 80% fully automatic wafer prober applications in industry.

SUMMARY

Accordingly, the market volume for fully automatic probing is substantially greater. However, none of the shielding solutions known in the art can be used at production level for fully automatic wafer probing.

There is therefore a very great need for an equivalent shielding solution at production level.

The solution known from DE 69 322 206 T2 is not applicable to fully automatic wafer probing, as it is too complex and therefore too expensive and is made up of shielding elements that are not to be used in a fully automatic wafer prober (e.g., metal shielding screens which do not withstand continuous operation in production, etc.).

The solution known from DE 41 09 908 A1 addresses the problem that the upwardly open cover is inevitably located beneath the wafer to be tested during probing. Otherwise, there would be a risk of the very expensive test card being damaged. This means that the wafer being tested is unprotected at precisely the moment when the test takes place. Consequently, the second solution known in the art is likewise unusable when it comes to achieving complete shielding of the wafer or deliberate conditioning of the environment around the wafer.

The solution known from EP 2 659 279 B1 generates an air flow on the wafer surface which leads to thermal inhomogeneity and to unwanted particle transportation. Likewise, this solution is restricted to one or a few microchips located spatially close to one another, and also to the increase in environmental pressure, in order to reduce the electrical conductivity of the air. This proposed solution is not suitable for other applications of a shield, or even for shielding an entire wafer.

For the aforementioned reasons, none of the concepts known in the art have become established to date in the field of fully automatic wafer probing.

A problem addressed by the present invention is therefore that of creating a shielding device for a chuck, a corresponding chuck, and a corresponding wafer prober setup, which are suitable for production, reliable, and economical.

An idea on which the present invention is based involves the shielding device being fitted with a ring mechanism having a first ring and a second ring, which mechanism can form a shielding volume. The first ring can be attached to an outer periphery of the chuck, where the second ring is mounted on the first ring so as to be displaceable along a vertical axis of the chuck in relation to the first ring.

A pretensioning device is provided which is used for the elastic pretensioning of the second ring in relation to the first ring along the vertical axis (HA) of the chuck, so that the second ring in the chuck projects beyond the upper side of the chuck in the mounted state. The second ring has a cavity, and bores communicating therewith, where the cavity has a connection for connecting a gas supply device. Via the gas supply device, an air bearing can be produced via the bores opposite a plate-shaped counter bearing above the second ring in relation to the vertical axis of the chuck, where the pretensioning device can be compressed by the air bearing in such a manner that there is no contact between the second ring and the plate-shaped counter bearing.

The shielding device for a chuck according to an example embodiment of the present invention, the corresponding chuck, and the corresponding wafer prober setup have the advantage that they are suitable for integration or retrofitting in standard commercial wafer probers and are easy to assemble and dismantle. Furthermore, the shielding device according to an example embodiment of the present invention can preferably be operated using air as the working fluid, where this air can also be used for a corresponding chuck system of the wafer prober. In other words, with wafer probers of this kind, the source for the working fluid already exists in the form of air, and integration or retrofitting simply requires further connections or control modules for the shielding device to be supplied.

The smaller the structures on the chip, the cleaner the test environment has to be. At the wafer frontend, very expensive super-clean rooms are provided for this purpose. This is not customary with wafer testing (and also not desirable, as it is very expensive). However, if tests have to be carried out under improved clean room conditions, the state of the art is a front filter unit (FFU). This has very fine filters and sits at the front (and partially behind) on the prober. The air is moved through the prober by large fans, like a wind resulting from this, and is very clean. This is of course laborious and has many disadvantages (expensive, large, has a detrimental effect on the temperature on the chuck). With the new shielding device according to an example embodiment of the present invention, this can be achieved in a far more elegant and cost-efficient manner and with few disadvantages for the other parameters. In particular, a (light), very fine (filtered) air flow can be produced in the shielding chamber, so that no particles can enter due to the overpressure produced, ideally using purified, filtered, very clean compressed air. This means that the cost of the aforementioned fans, etc. is saved.

According to a further preferred example embodiment, the second ring is mounted in a displaceable manner on a lateral side of the first ring facing away from the chuck, or facing the chuck, which side runs substantially parallel to the outer periphery of the chuck. A setup of this kind can easily be achieved.

According to a further preferred example embodiment, the second ring is mounted displaceably in a recess in the first ring. This kind of design is particularly space-saving.

According to a further preferred example embodiment, a substantially fluid-tight plain bearing mechanism is provided between the second ring and the first ring. This allows particularly effective shielding.

According to a further preferred example embodiment, the pretensioning device has a spring mechanism which rests on the first ring and the second ring.

According to a further preferred example embodiment, the pretensioning device has a pneumatic lifting device, via which the second ring can be raised and lowered in relation to the first ring. This improves accessibility for an automatic wafer handler.

According to a further preferred example embodiment, the pneumatic lifting device is attached to the first ring and connected to the second ring by means of a lifting rod.

According to a further preferred example embodiment, a stop mechanism is provided which restricts a displacement of the second ring along a vertical axis of the chuck relative to the first ring. This ensures a stable end position of the second ring.

According to a further preferred example embodiment, the stop mechanism is adjustable. This improves flexibility.

According to a further preferred example embodiment, the ring mechanism is formed from an electrical or magnetic shielding material. Consequently, multiple functionality can be achieved on the part of the shield.

Exemplary embodiments of the invention are depicted in the drawings, in which the same reference signs denote identical or functionally identical components, and are explained in greater detail in the following description.

DETAILED DESCRIPTION

Figure 1A:
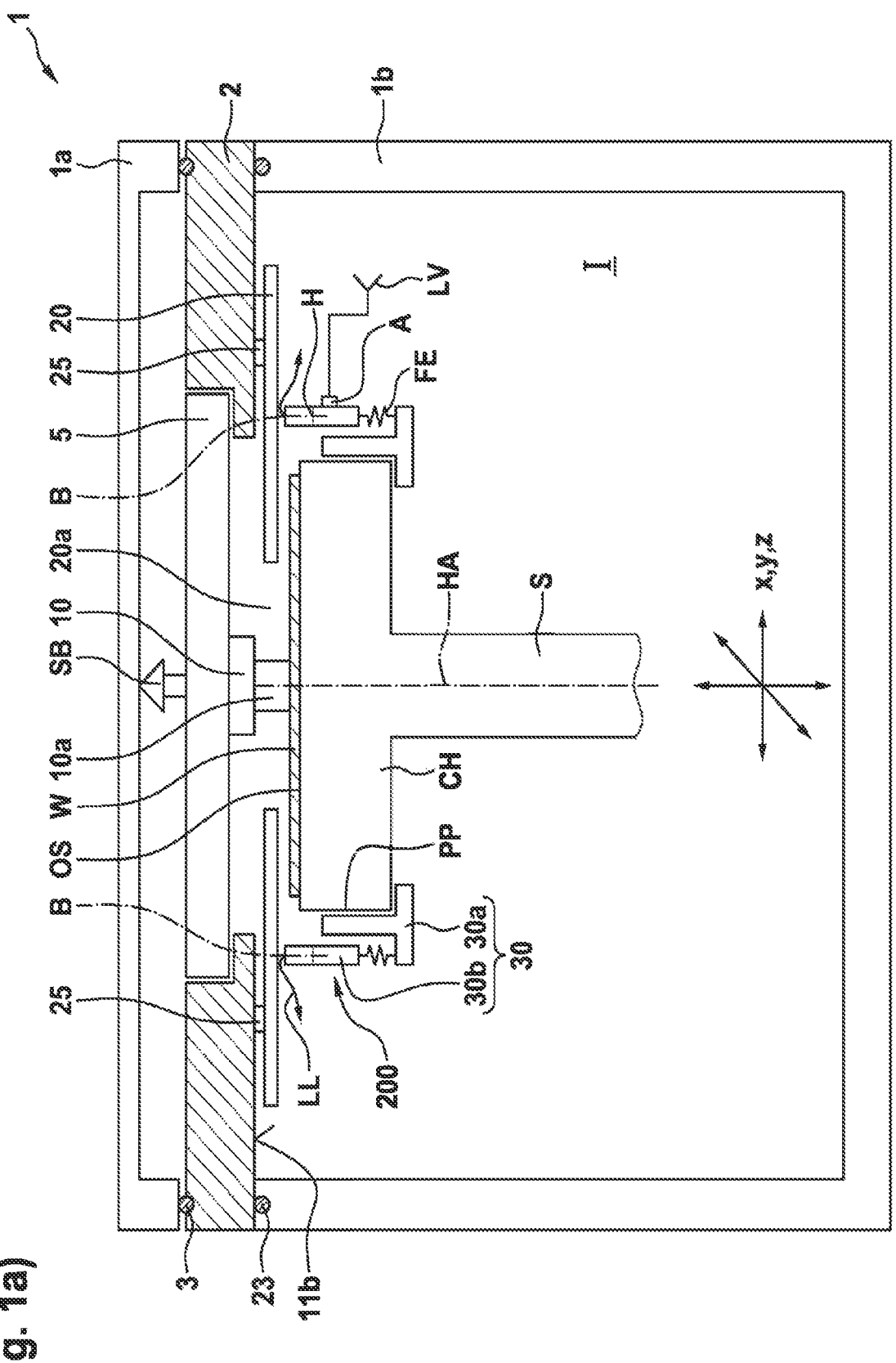
FIGS. 1a)-1c) show a wafer prober setup with a shielding device according to a first embodiment of the present invention, namely in FIG. 1a) a cross-sectional representation, in FIG. 1b) a partial representation of the plan view of the chuck, and in FIG. 1c) a partial representation of a cross section through the second ring of the ring mechanism.
Figure 1B:
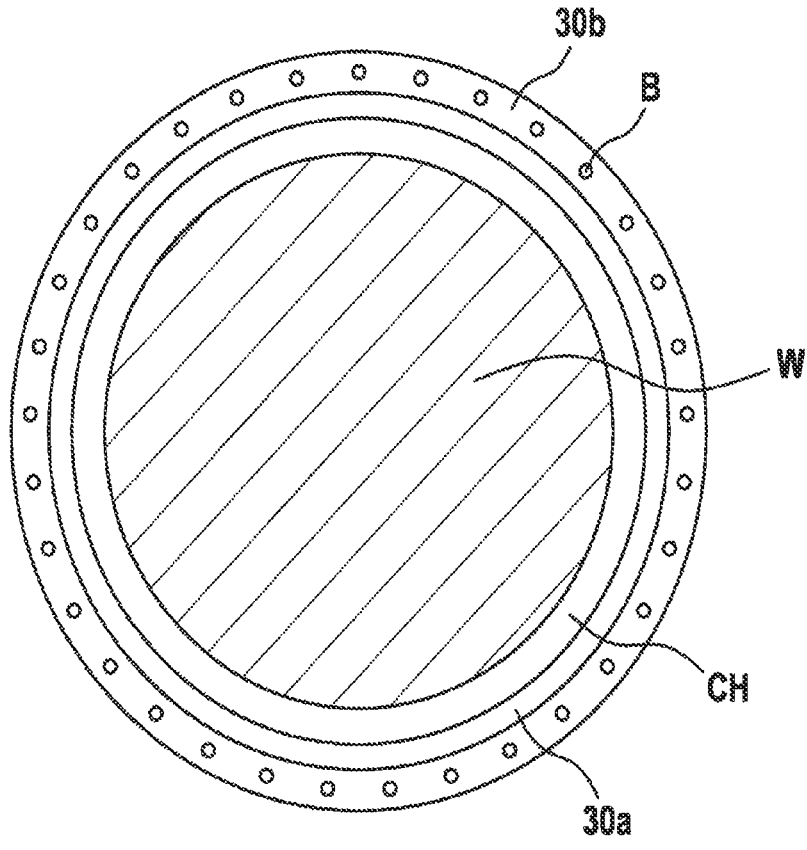
Figure 1C:
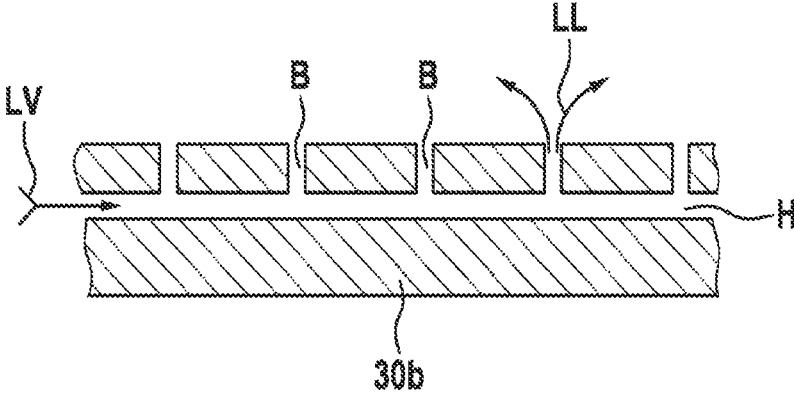

FIGS. 1a)-1c) show a wafer prober setup with a shielding device according to a first example embodiment of the present invention, namely in FIG. 1a) a cross-sectional representation, in FIG. 1b) a partial representation of the plan view of the chuck, and in FIG. 1c) a partial representation of a cross section through the second ring of the ring mechanism.

In FIG. 1, reference sign 1 denotes a wafer prober that has an optional upper part 1a and a lower part 1b. Reference sign 2 denotes a mount for a probe card 5, that can be folded up in respect of the lower part 1b or is removable and is sealed in relation to said lower part by means of a sealing device 23. The upper part 1a can be folded up in respect of the mount 2 or removed and sealed in relation to said mount by means of a sealing device 3.

In the lower part 1b of the wafer prober 1 is located a chuck CH that can be temperature-controlled using a temperature-control device (not shown). The chuck CH is located on a base S that can be moved using a programmable control in x, y and z directions, where the vertical adjustment direction, or z-direction, is defined by the vertical axis HA of the chuck.

Electrical connections and fluid connections for the chuck CH and the inside I are provided in the lower part 1b; these are not depicted in the present case for reasons of clarity.

A wafer W for testing with a plurality of chips for testing is clamped to the upper side OS of the chuck CH.

The probe card 5 in the form of a printed circuit is suspended in the mount 2, e.g., screwed or fastened in some other way. The mount 2 is usually produced from aluminium or steel, as are the supporting parts of the wafer prober 1.

On the side of the probe card 5 facing the inside I of the wafer prober 1 is located a needle head 10 with a needle device 10A attached thereto for making contact with electronic circuits on the wafer W. The needle head 10 with needle device 10A projects downwards from the probe card 5 into the inside I.

On the side of the probe card 5 facing away from the inside I is located a signal line bus SB, via which the test signals are conveyed from the probe card 5 to a corresponding tester (not shown).

A shielding device 200 according to the first embodiment is provided beneath the mount 2 with the probe card 5 clamped therein, said shielding device having a shielding plate 20 which, like the upper region, has a through opening 20a for the needle head 10 with the needle device 10A and which is connected to the upper region via a sealing fastening device 25.

Furthermore, the shielding device 200 has a two-part ring mechanism 30 that has an inner first ring 30a and an outer second ring 30b. The inner first ring 30a is attached, e.g., screwed, fixedly and in a fluid-tight manner to an outer periphery PP of the chuck CH, about said chuck CH, and has a diameter which is slightly greater than the diameter of the chuck CH.

The outer second ring 30b is attached to the inner first ring 30a so as to be displaceable along the vertical axis, i.e., in a vertical adjustment direction z of the chuck CH, for example by means of a substantially fluid-tight plain bearing mechanism (not shown).

Between the inner first ring 30a and the outer second ring 30b is provided an elastic pretensioning device, which is designed as a spring mechanism FE in the case of the first embodiment. The pretensioning device or spring mechanism FE pretensions the outer ring 30b elastically along the vertical axis, i.e., in the vertical adjustment direction z of the chuck CH, so that it projects beyond the upper side of the wafer W placed on it in the direction of the shielding plate 20.

The depiction in FIG. 1 shows the chuck CH in its upper end position, in which the needle device 10a is to be placed on corresponding contact faces of a chip of the wafer W to be tested. This upper end position is defined by the needle length and further design parameters of the needle head 10 and can be pre-programmed in the control system.

It is evident from FIG. 1 that the upper end position has a floating design, that can be achieved in that a ring-shaped cavity H with many small bores B is introduced in the upper part of the movable outer second ring 30b. These bores B are oriented upwardly in the vertical adjustment direction z of the chuck CH in relation to the shielding plate 20. The cavity H is provided with a separate air supply device LV via a corresponding connection A.

The air supplied to the bores B by the air supply device LV acts upwardly like an air bearing LL, which causes the shielding plate 20, which is of such a size that the upper part of the outer second ring 30b can always be pressed against it by means of the air bearing LL, i.e., in every measuring position, where the pretensioning device or spring mechanism FE can be compressed accordingly.

The fluid seal between the inner first ring 30a and the outer second ring 30b, and also between the inner first ring 30a and the chuck CH, are selected or configured accordingly.

Conversely, the pretensioning device or spring mechanism FE expands when the chuck CH is moved into its lower end position, for example in order to perform an automatic changeover of the wafer W by an automatic handler.

Consequently, the wafer W being tested is completely enclosed by the shielding device 200, and therefore shielded, except for the very small air bearing gap (normally in the μ-range). The air bearing LL and the spring-mounted bearing of the outer second ring 30b by means of the pretensioning device or spring mechanism FE allow this full enclosure, when the displacement path is of a corresponding size, including at different working heights of the chuck CH, that can occur with different needle lengths or designs of the needle device 10A, for example, or through the small, usually 0.5 mm long, vertical lifting movement which is necessary in order to break the contact between needles of the needle device 10A and the wafer W during movement to the next chip.

The face of the shielding plate 20 about the probe card 5 has the most planar configuration possible. The shielding plate 20 therefore has the advantage that the design and, above all, the surface treatment on a small part (shielding plate 20) can be formed more easily and economically than in the inner upper region of the inside I.

Figure 2:
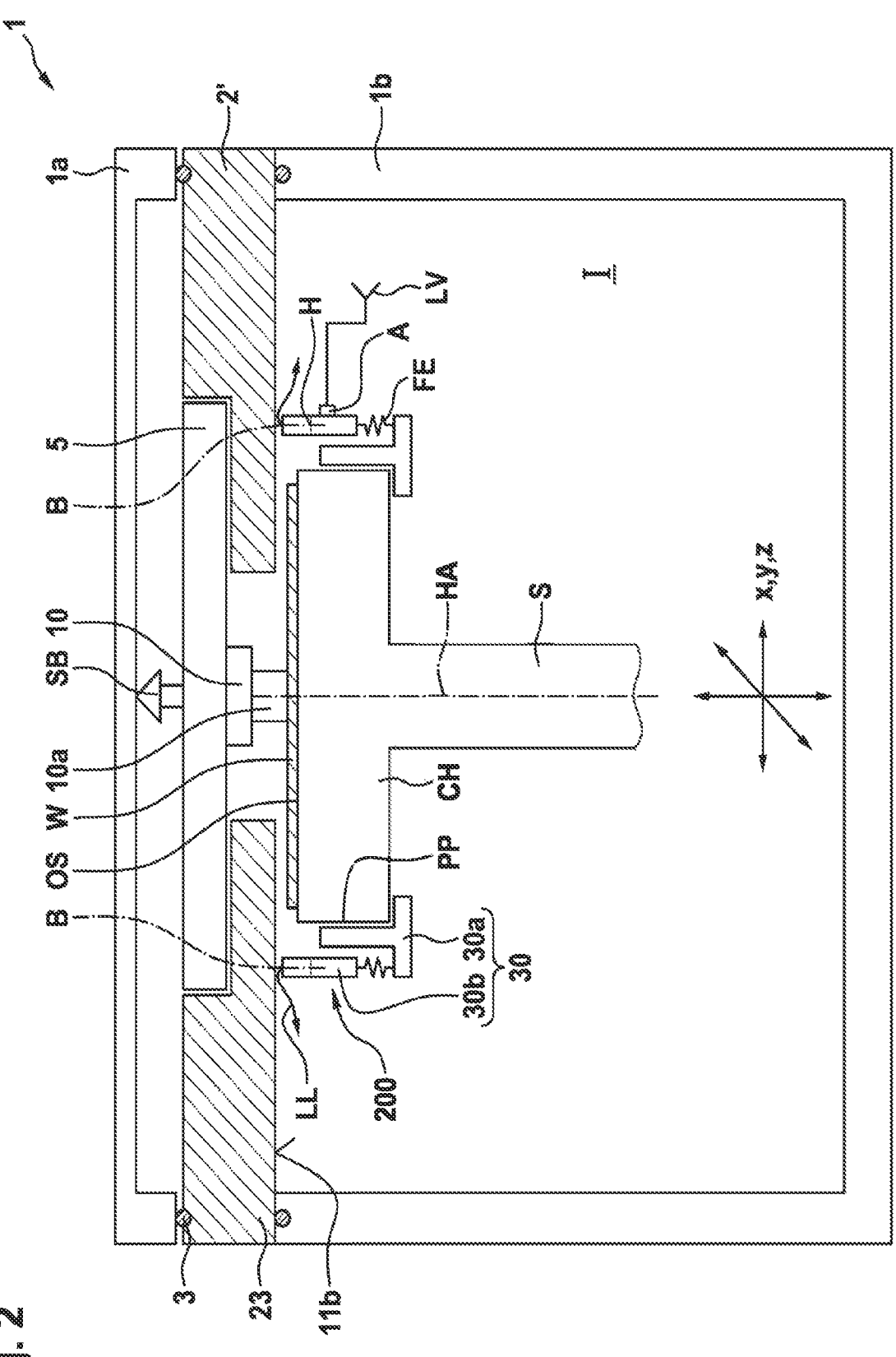
FIG. 2 shows a cross-sectional representation of a wafer prober setup with a shielding device according to a second example embodiment of the present invention.

In certain designs, the shielding plate 20 can also be dispensed with, however (cf. FIG. 2).

With the help of the air bearing LL, which moulds against this shielding plate 20 relatively closely as a plate-shaped counter bearing, a controlled environment can be produced around the chuck CH during the actual wafer test. This can happen in all variants which are only conceivable. For example, dry air for producing a good pressure dew point of the shielding device can be supplied via lines (not shown in the first embodiment, cf. FIGS. 3 and 5) that can, however, also be used to supply other process gases.

Another kind of shield could be an electrical shield. The parts of the shielding device 200 can be made from an electrically conductive material. As a result, these can be used for shielding or guard potential in a triaxial application. This facilitates far more interference-free measurements than previously in the case of relatively large shielding devices or chambers, which could ultimately be nothing other than the prober outer walls.

Likewise, another kind of shield is a magnetic shield. The parts of the shielding device 200 can be produced from magnetically protective material, such as MU metal, for example. This means that magnetic interference can be shielded from the wafer W being tested, e.g., the Earth's magnetic field.

Likewise, another kind of shield could be a thermal shield. Particularly in the case of wafer tests performed at extremely high or low temperatures, when the temperature difference between the ambient air and the wafer is very high, the ambient air often represents an interfering factor for good temperature accuracy. This could be improved by heating or cooling the space within the shielding device.

FIG. 2 shows a cross-sectional representation of a wafer prober setup with a shielding device according to a second embodiment of the present invention.

In the second embodiment, the plate-shaped counter bearing is formed by the inner face 11b of the upper region of the lower part 1b, so that the shielding plate 20 is dispensed with. This can be achieved in that the mount 2' for the probe card 5 in the upper region of the lower part 1b is differently designed compared with the first embodiment.

Otherwise, the second embodiment has a similar design to the first embodiment.

Figure 3:
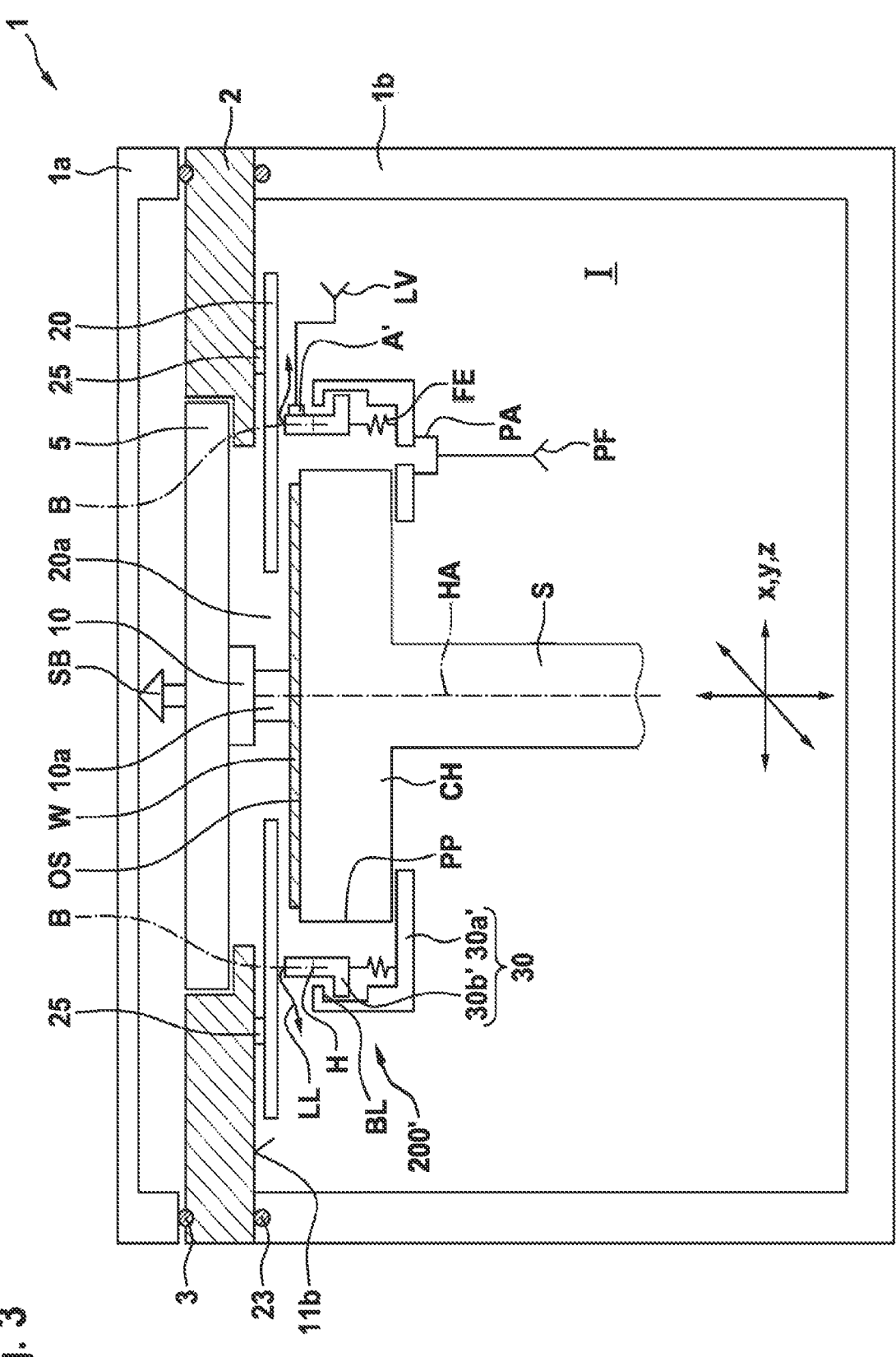
FIG. 3 shows a cross-sectional representation of a wafer prober setup with a shielding device according to a third example embodiment of the present invention.

FIG. 3 shows a cross-sectional representation of a wafer prober setup with a shielding device according to a third example embodiment of the present invention.

The shielding device 200' in the third embodiment differs from the shielding device in the first and second embodiment. It has a ring mechanism 30' with a first ring 30a' and a second ring 30b'.

On the first ring 30a' and on the second ring 30b' a stop mechanism BL is provided in the form of step profiles that limit a displacement of the second ring 30b' along a vertical axis HA of the chuck CH in relation to the first ring 30a'.

By means of an end position-controlled movement of the second ring 30b' of this kind, it is possible to ensure that there can be no unwanted collision between the second ring 30b' and the probe card 5 or the shielding plate 20.

Due to the stop mechanism BL, the connection A' for the gas supply device LV is attached to the second ring 30b' at a different point to the one used in the first and second embodiment.

Otherwise, the third embodiment has a similar design to the first embodiment.

Figure 4:
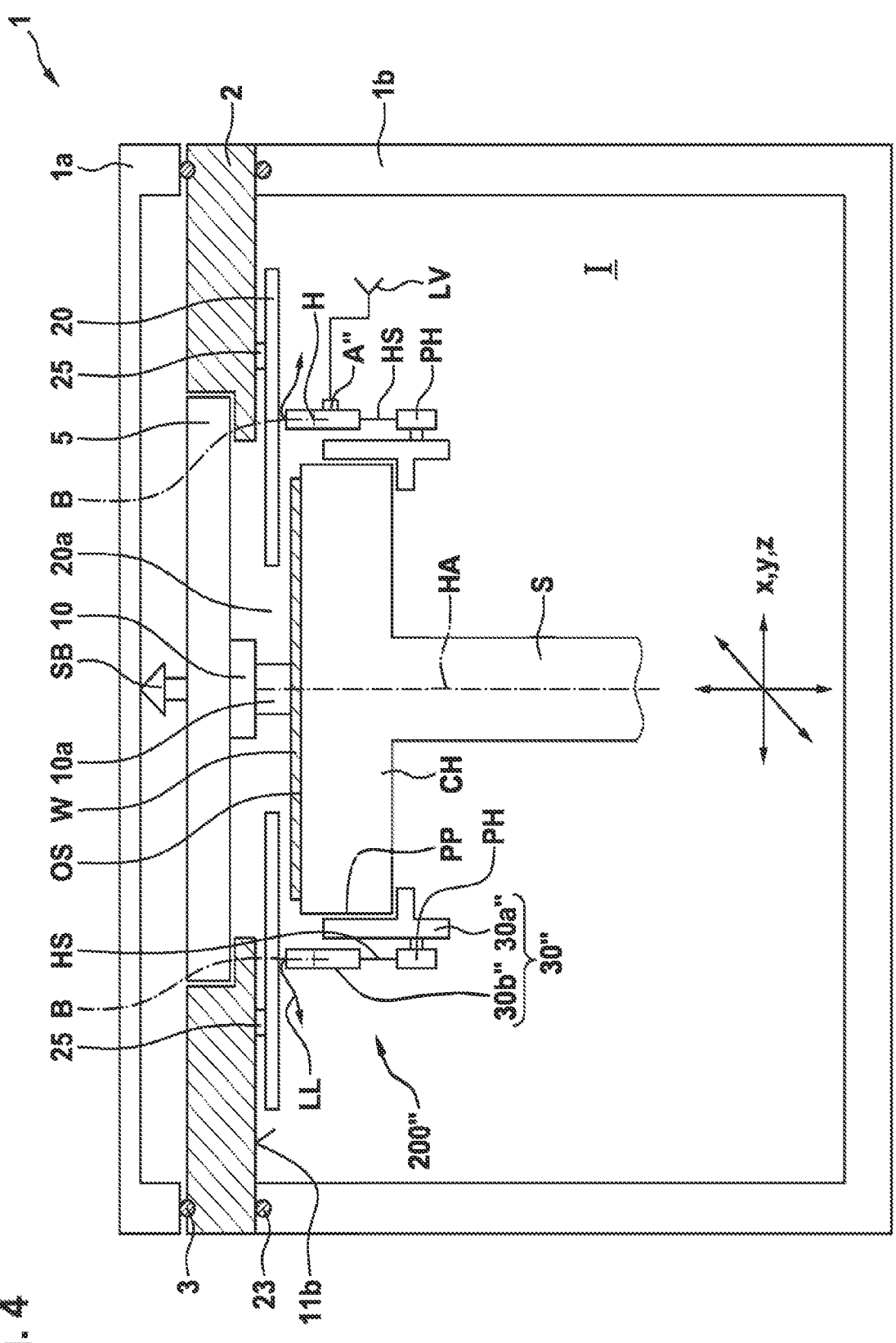
FIG. 4 shows a cross-sectional representation of a wafer prober setup with a shielding device according to a fourth example embodiment of the present invention.

FIG. 4 shows a cross-sectional representation of a wafer prober setup with a shielding device according to a fourth example embodiment of the present invention.

The shielding device 200'' in the fourth embodiment differs from the shielding device in the first and second embodiment. It has a ring mechanism 30'' with a first ring 30a'' and a second ring 30b''.

The shielding device 200'' has a pretensioning device with a pneumatic lifting device PH, by means of which the second ring 30b'' can be lifted and lowered in respect of the first ring 30a''. This can be achieved by means of a piston (not shown), for example, which interacts with an air cushion as the spring mechanism or a spring mechanism, for example.

The pneumatic lifting device PH is attached to the first ring 30a'' and connected to the second ring by means of a lifting rod.

Otherwise, the third embodiment is designed in a similar way to the first embodiment.

Figure 5:
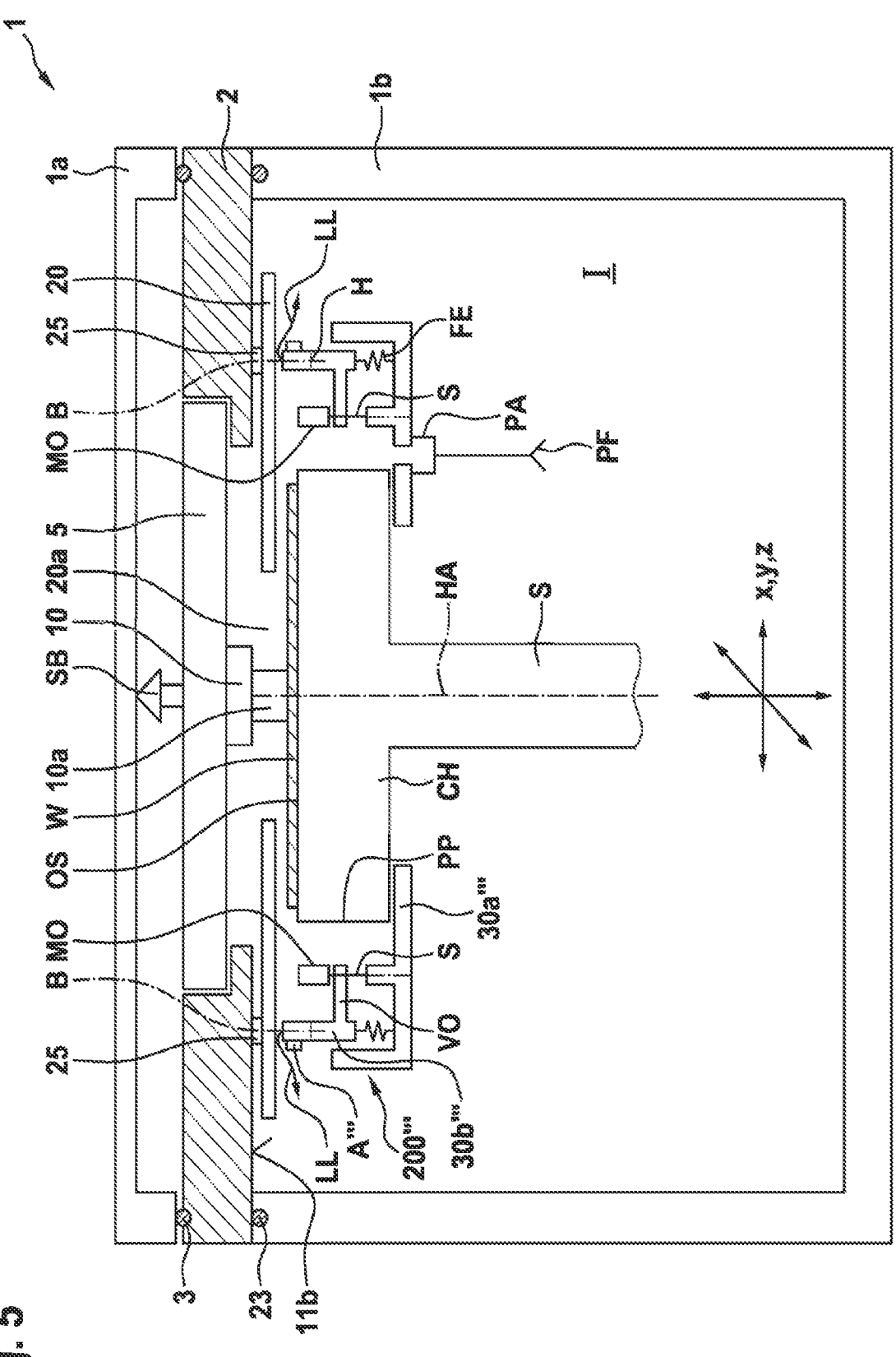
FIG. 5 shows a cross-sectional representation of a wafer prober setup with a shielding device according to a fifth example embodiment of the present invention.

FIG. 5 shows a cross-sectional representation of a wafer prober setup with a shielding device according to a fifth example embodiment of the present invention.

The shielding device 200' in the fifth embodiment differs from the shielding device in the first and second embodiment. It has a ring mechanism 30''' with a first ring 30a''' and a second ring 30b'''.

As in the second embodiment, a stop mechanism MO is provided which limits a displacement of the second ring 30b''' along the vertical axis HA of the chuck CH in relation to the first ring 30a'''.

However, the stop mechanism MO is adjustable in the fifth embodiment. This can be achieved in that the stop mechanism has an electric motor, the housing of which is used as a stop. The second ring 30b''' has a projection VO through which a rod S, that can be rotated by the electric motor, is guided in a sliding manner. The rod S has a thread at one end which is operatively connected to a thread in the region of the first ring 30a''' lying thereunder. In this way, the height of the stop can be raised or lowered, and with it the upper end position of the second ring 30b'''.

Due to the stop mechanism MO, the connection A' for the gas supply device LV is, moreover, attached to the second ring 30b''' at a different point to the one used in the first and second embodiment.

Otherwise, the third embodiment has a similar design to the first embodiment.

Figure 6:
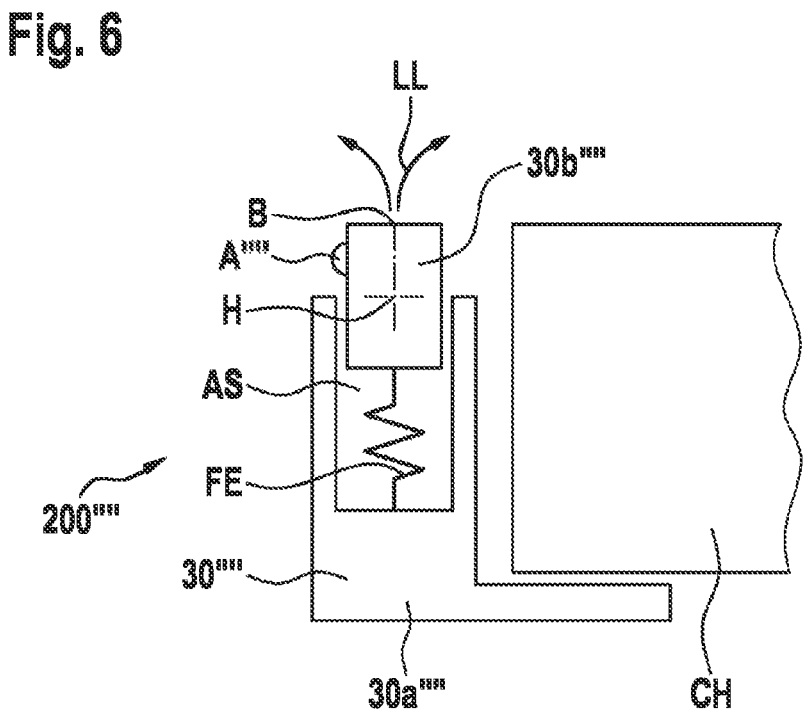
FIG. 6 shows a partial cross-sectional representation of a wafer prober setup with a shielding device according to a sixth example embodiment of the present invention.

FIG. 6 shows a partial cross-sectional representation of a wafer prober setup with a shielding device according to a sixth example embodiment of the present invention.

The shielding device 200'''' in the fifth embodiment differs from the shielding device in the first and second embodiment. It has a ring mechanism 30'''' with a first ring 30a'''' and a second ring 30b''''.

In the previous embodiments, the second ring is mounted in a displaceable manner on a lateral side of the first ring facing away from the chuck, or facing the chuck, which side runs substantially parallel to the outer periphery of the chuck.

Conversely, in the sixth embodiment, the second ring 30b'''' is mounted displaceably in a recess in the first ring 30a'''.

The connection A"" for the gas supply device LV is also attached to the second ring 30*b*"" at a different point to the one used in the fifth embodiment.

Otherwise, the third embodiment has a similar design to the first embodiment.

Although the present invention has been explained above in connection with example embodiments, it is not limited to these embodiments, but can be modified in a variety of ways. For example, the geometric form of the shielding device is not limited to a circular shape, but can adopt any geometry, and the materials specified for the shielding device are also only exemplary and can be varied to a large extent.

The invention claimed is:

1. A shielding device for a chuck, the shielding device comprising:
 a plate-shaped counter bearing;
 a ring mechanism that includes:
  a first ring attachable to an outer periphery of the chuck; and
  a second ring that is mounted, relative to a vertical axis of the chuck when the ring mechanism is mounted to the chuck, below the plate-shaped counter bearing and on the first ring in a manner by which the second ring is displaceable, relative to the first ring, along the vertical axis; and
 a pretensioning device configured to provide an elastic pretensioning of the second ring relative to the first ring along the vertical axis, so that the second ring projects beyond an upper side of the chuck when the ring mechanism is mounted to the chuck;
 wherein:
  the second ring includes a connection:
   (i) that leads to a cavity of the second ring that communicates with bores of the second ring; and
   (ii) to which is connectable a gas supply device using which an air bearing can be produced via the bores (a) above the second ring and (b) opposite the plate-shaped counter bearing; and
  the pretensioning device is compressible by the air bearing in a manner by which there is no contact between the second ring and the plate-shaped counter bearing.

2. The shielding device according to claim 1, wherein the second ring is mounted in a displaceable manner on a lateral side of the first ring that (i) faces away from the chuck and (ii) runs substantially parallel to the outer periphery of the chuck.

3. The shielding device according to claim 1, wherein the second ring is mounted in a displaceable manner on a lateral side of the first ring that (i) faces the chuck and (ii) runs substantially parallel to the outer periphery of the chuck.

4. The shielding device according to claim 1, wherein the second ring is mounted displaceably in a recess in the first ring.

5. The shielding device according to claim 1, wherein a substantially fluid-tight plain bearing mechanism is provided between the second ring and the first ring.

6. The shielding device according to claim 1, wherein the pretensioning device includes a spring that rests on the first ring and the second ring.

7. The shielding device according to claim 1, wherein the pretensioning device includes a pneumatic lifting device, via which the second ring can be raised and lowered relative to the first ring.

8. The shielding device according to claim 7, wherein the pneumatic lifting device is attached to the first ring and connected to the second ring via a lifting rod.

9. The shielding device according to claim 1, further comprising a stop that restricts a displacement of the second ring along the vertical axis of the chuck relative to the first ring.

10. The shielding device according to claim 9, wherein the stop is adjustable.

11. The shielding device according to claim 1, wherein the ring mechanism is formed of an electrical or magnetic shielding material.

12. An apparatus comprising:
 a chuck; and
 a shielding device that includes:
  a plate-shaped counter bearing;
  a ring mechanism that includes:
   a first ring attached to an outer periphery of the chuck; and
   a second ring that is mounted, relative to a vertical axis of the chuck, below the plate-shaped counter bearing and on the first ring in a manner by which the second ring is displaceable, relative to the first ring, along the vertical axis; and
  a pretensioning device configured to provide an elastic pretensioning of the second ring relative to the first ring along the vertical axis, so that the second ring projects beyond an upper side of the chuck;
 wherein:
  the second ring includes a connection:
   (i) that leads to a cavity of the second ring that communicates with bores of the second ring; and
   (ii) to which is connectable a gas supply device using which an air bearing can be produced via the bores (a) above the second ring and (b) opposite the plate-shaped counter bearing; and
  the pretensioning device is compressible by the air bearing in a manner by which there is no contact between the second ring and the plate-shaped counter bearing.

13. A structure comprising:
 a chuck;
 a shielding device that includes:
  a ring mechanism that includes:
   a first ring attached to an outer periphery of the chuck; and
   a second ring that is mounted, relative to a vertical axis of the chuck, below a plate-shaped counter bearing and on the first ring in a manner by which the second ring is displaceable, relative to the first ring, along the vertical axis; and
  a pretensioning device configured to provide an elastic pretensioning of the second ring relative to the first ring along the vertical axis, so that the second ring projects beyond an upper side of the chuck; and
 a wafer probe arrangement that includes:
  an upper part;
  a lower part inside which the chuck is arranged;
  a probe card suspended, above the chuck, in an upper region of the lower part;
  a test wafer;
  a needle; and
  a needle head (i) for making contact with electronic circuits on the test wafer, (ii) to which the needle is attached, (iii) arranged on a side of the probe card that faces the inside of the lower part, and (iv) projects downwards from the probe card into the inside of the lower part;

wherein:

the second ring includes a connection:

(i) that leads to a cavity of the second ring that communicates with bores of the second ring; and (ii) to which is connectable a gas supply device using which an air bearing can be produced via the bores (a) above the second ring and (b) opposite the plate-shaped counter bearing;

the pretensioning device is compressible by the air bearing in a manner by which there is no contact between the second ring and the plate-shaped counter bearing;

the chuck is movable laterally and vertically corresponding to a plurality of test positions on the test wafer; and the shielding device shields all of the plurality of test positions on the test wafer.

14. The structure according to claim 13, wherein an inner face of the upper region of the lower part forms the plate-shaped counter bearing.

15. The structure according to claim 13, wherein a shielding plate, that forms the plate-shaped counter bearing and has a feedthrough opening for the needle device, is connected to an inner face of the upper region of the lower part via a sealing fastener.

16. The structure according to claim 13, wherein the chuck is automatically movable to the plurality of test positions on the test wafer.

\* \* \* \* \*